United States Patent
Hsu et al.

(10) Patent No.: US 9,268,129 B2
(45) Date of Patent: Feb. 23, 2016

(54) DRIVING CALIBRATION APPARATUS OF ELECTROSTATIC MEMS SCANNING MIRROR AND DRIVING CALIBRATION METHOD THEREOF

(71) Applicant: LITE-ON IT CORPORATION, Taipei (TW)

(72) Inventors: Chia-Hao Hsu, Hsinchu (TW); Yu-Nan Tsai, Hsinchu (TW)

(73) Assignee: Lite-On Technology Corporation, Taipei (TW)

( * ) Notice: Subject to any disclaimer, the term of this patent is extended or adjusted under 35 U.S.C. 154(b) by 220 days.

(21) Appl. No.: 14/215,088

(22) Filed: Mar. 17, 2014

(65) Prior Publication Data

US 2015/0185468 A1    Jul. 2, 2015

(30) Foreign Application Priority Data

Dec. 27, 2013   (CN) .......................... 2013 1 0747059

(51) Int. Cl.
*G02B 26/08* (2006.01)
*G02B 26/10* (2006.01)

(52) U.S. Cl.
CPC .......... *G02B 26/0841* (2013.01); *G02B 26/105* (2013.01)

(58) Field of Classification Search
CPC ............... G02B 6/357; G02B 26/0841; G02B 26/0833; G02B 26/105
See application file for complete search history.

(56) References Cited

U.S. PATENT DOCUMENTS

| | | | |
|---|---|---|---|
| 2001/0015750 A1* | 8/2001 | Enomoto | B41J 2/465 347/234 |
| 2015/0015929 A1* | 1/2015 | Wilhelm | G02B 21/0088 359/226.1 |
| 2015/0138623 A1* | 5/2015 | Graves | G02B 6/3518 359/290 |

* cited by examiner

*Primary Examiner* — James Phan
(74) *Attorney, Agent, or Firm* — Jianq Chyun IP Office (57) ABSTRACT

The invention provides a driving calibration apparatus of an electrostatic MEMS scanning mirror and a driving calibration method thereof The driving calibration method includes the following steps. Different reference voltages are sequentially set to drive a plane mirror of the electrostatic MEMS scanning mirror to swing. Projection positions on a projected surface corresponding to the reference voltages that the laser beam projects to are determined. A driving lookup table is established according to the reference voltages and the corresponding projection positions. Calibrated driving voltages corresponding to ideal projection positions are determined according to the driving lookup table. The pane mirror is driven to swing according to the calibrated driving voltages.

10 Claims, 5 Drawing Sheets

DRIVING CALIBRATION APPARATUS OF ELECTROSTATIC MEMS SCANNING MIRROR AND DRIVING CALIBRATION METHOD THEREOF

CROSS-REFERENCE TO RELATED APPLICATION

This application claims the priority benefit of China application serial no. 201310747059.2, filed on Dec. 27, 2013. The entirety of the above-mentioned patent application is hereby incorporated by reference herein and made a part of this specification.

BACKGROUND

1. Field of the Invention

The invention is directed to a driving calibration apparatus and a driving calibration method thereof. More particularly, the invention is directed to an apparatus for calibrating driving voltages of an electrostatic MEMS scanning mirror and a driving calibration method thereof

2. Description of Related Art

An MEMS scanning mirror is an important device for transmitting optical signals and is widely applied to optical-electro-mechanical system integrated products and techniques, such as projectors, barcode readers, optical modulators, optical choppers, optical switches, optical positioning, and so forth. The MEMS scanning mirror is composed of an actuator and a plane mirror, the actuator is in charge of applying a force on the plane mirror to enable the plane mirror to generate angular displacement so as to reflect an incident optical signal, and a transmission direction of the optical signal is determined according to the angular displacement of the plane mirror. Methods for driving the MEMS scanning mirror are typically classified into an electrostatic, an electromagnetic, a thermo and a piezoelectric methods. Among them, the electrostatic MEMS scanning mirror has advantages, such as greater driving force and better compliance in semiconductor manufacturing processes and thus, have high potential.

When being applied in biaxial scanning, the electrostatic MEMS scanning mirror controls swing angles by means of controlling DC voltages. Since the swing angles of the electrostatic MEMS scanning mirror is not linearly relative to the DC voltages, difficulties occur in controlling the swing angles of the electrostatic MEMS scanning mirror, and as a result, the electrostatic MEMS scanning mirror probably incurs an issue of non-uniform scanning intervals. More specifically, when being applied in image projection, the issue of non-uniform scanning intervals probably incurs an issue of non-uniform brightness of images projected by the electrostatic MEMS scanning mirror.

SUMMARY

The invention provides a driving calibration apparatus of an electrostatic MEMS scanning mirror and a driving calibration method thereof capable of calibrating driving voltages for the electrostatic MEMS scanning mirror to avoid the issue of non-uniform scanning intervals.

The invention is directed to a driving calibration apparatus of an electrostatic MEMS scanning mirror. The electrostatic MEMS scanning mirror includes a plane minor serving to guide a laser beam to project on a projected surface. The driver calibrating apparatus includes a voltage setting unit, an image capture unit and a data processing unit. The voltage setting unit serves to set a plurality of different reference voltages to drive the plane minor to swing. The image capture unit serves to detect a plurality of projection positions on the projected surface corresponding to the plurality of reference voltages that the laser beam projects to. The data processing unit serves to establish a driving lookup table according to the reference voltages and the corresponding projection positions and determine calibrated driving voltages corresponding to a plurality of ideal projection positions according to the driving lookup table, wherein the voltage setting unit drives the plane mirror to swing according to the calibrated driving voltages.

The invention is directed to a driving calibration method of an electrostatic MEMS scanning mirror. The electrostatic MEMS scanning minor includes a plane minor for guiding a laser beam to project on a projected surface. The driver calibrating method includes the following steps. A plurality of different reference voltages is set to drive the plane minor to swing. A plurality of projection positions on the projected surface corresponding to the plurality of different reference voltages that the laser beam projects to is detected. A driving lookup table is established according to the reference voltages and the corresponding projection positions. Calibrated driving voltages respectively corresponding to a plurality of ideal projection positions are determined according to the driving lookup table. And, the plane minor is driven to swing according to the calibrated driving voltage.

In an embodiment of the invention, the reference voltages are between a ground voltage and a maximum voltage.

In an embodiment of the invention, each of the reference voltage has a corresponding projection position.

In an embodiment of the invention, voltage differences between the reference voltages are the same.

In an embodiment of the invention, the plane mirror is being swung around a first axis and a second axis, and when the voltage setting unit sequentially sets the different reference voltages to drive the plane mirror to swing around the first axis, the plane mirror is in a static state on the second axis.

In an embodiment of the invention, the ideal projection positions are set to be a plurality of projection positions of light spots on the projected surface that the laser beam projects to and the ideal projection positions have a constant interval spacing from each other.

Based on the above, in the driving calibration apparatus of the electrostatic MEMS scanning mirror of the invention and the driving calibration method thereof, a plurality of different reference voltage is sequentially set, and the reference voltage corresponding to each of the projection positions is determined. Thereby, the driving voltages of the electrostatic MEMS scanning mirror can be calibrated to prevent images from having non-uniform brightness.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
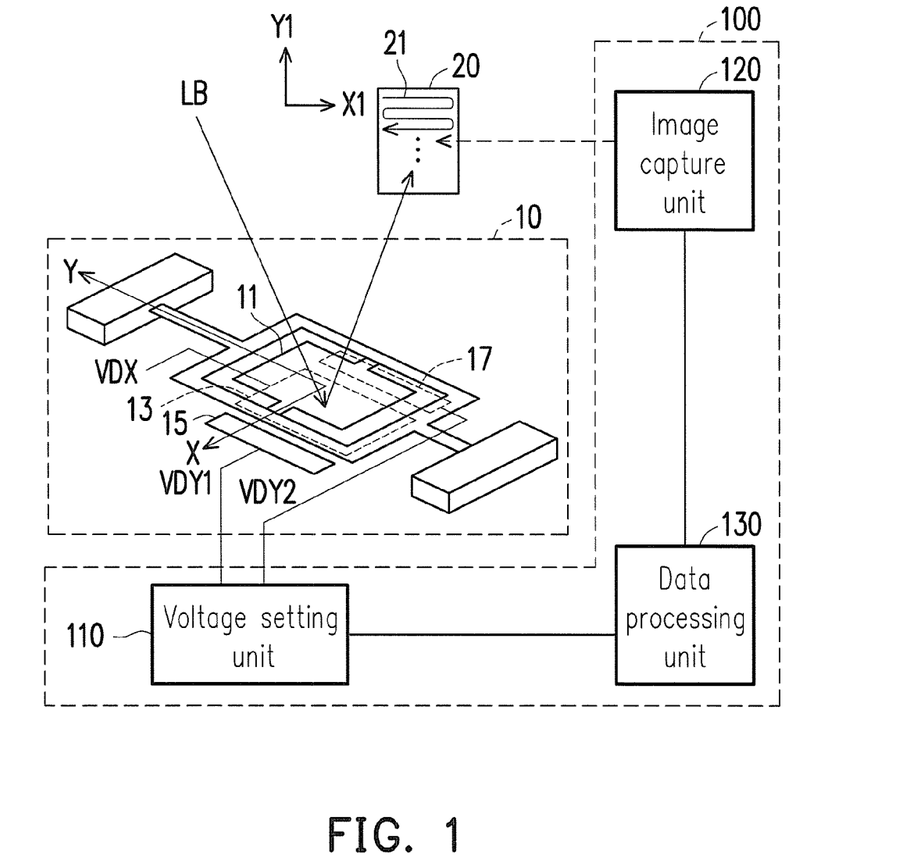
FIG. 1 is a schematic diagram illustrating an electrostatic MEMS scanning mirror and a driving calibration apparatus thereof according to an embodiment of the invention.

FIG. 1 is a schematic diagram illustrating an electrostatic MEMS scanning mirror and a driving calibration apparatus thereof according to an embodiment of the invention. With reference to FIG. 1, in the present embodiment, an electrostatic MEMS scanning mirror 10 is a biaxial MEMS scanning mirror and includes a plane mirror 11, a first driving electrode 13, a second driving electrode 15 and a third driving electrode 17. The plane mirror 11 serves to reflect a laser beam LB to a projected surface 20, and the swing of the plane mirror 11 decides projection positions on the projected surface 20 that the laser beam LB projects to.

The first driving electrode 13 serves to receive an X-axial driving signal VDX to drive the plane mirror 11 to swing back and forth with the X axis as an axial center and guide the laser beam LB to scan back and forth along an X1 axis of the projected surface 20. In the present embodiment, the X-axial driving signal VDX is a pulse signal. The second driving electrode 15 and the third driving electrode 17 respectively serves to receive a first Y-axial driving voltage VDY1 and a second Y-axial driving voltage VDY2 to drive the plane mirror 11 to swing back and forth with the Y axis as an axial center and guide the laser beam LB to scan back and forth along a Y1 axis of the projected surface 20. A swing frequency of the plane mirror 11 swinging around the X axis is different from a swing frequency of the plane mirror 11 swinging around the Y axis. In the present embodiment, the swing frequency of the plane mirror 11 swinging around the X axis is higher than the swing frequency of the plane mirror 11 swinging around the Y axis. In other words, the swinging around the X axis is a swinging on a fast-axis while the swinging around the Y axis is a swinging on a slow-axis. Moreover, while the plane mirror 11 is controlled by the X-axial driving signal VDX to swing around the X axis, the plane mirror 11 is also controlled by the first Y-axial driving voltage VDY1 and the second Y-axial driving voltage VDY2 to swing around the Y axis. Due to the swinging frequency around the X axis is higher than the swinging frequency round the Y axis, a projection track of the laser beam LB is similar to a track 21.

In the present embodiment, the fast-axis (X axis) swinging of the plane mirror 11 is a resonance frequency swinging. After the first driving electrode 13 receives the driving signal, the plane mirror 11 swings around the fast axis (X axis) at the resonance frequency. In the slow-axis (Y-axis) swinging of the plane mirror 11, an angle for the plane minor 11 swing around the slow-axis (Y axis) is controlled by voltage levels provided by the second driving electrode 15 and the third driving electrode 17 step by step. In the invention, the X axis, the Y axis, the X1 axis and the Y1 axis are illustrated merely for descriptive convenience, but the invention is not limited thereto.

In the present embodiment, the electrostatic MEMS scanning minor 10 controls the angle for the plane mirror 11 swinging around the Y axis through the first Y-axial driving voltage VDY1 and the second Y-axial driving voltage VDY2, so as to control projection position of the laser beam LB projecting on the projected surface 20 along the Y1 axis. However, the first Y-axial driving voltage VDY1, the second Y-axial driving voltage VDY2 and the swinging angle of the plane mirror 11 around the Y axis do not belong to a linear system, and as a result, the first Y-axial driving voltage VDY, the second Y-axial driving voltage VDY2 and the projection positions of the laser beam LB along the Y1 axis also do not belong to a linear system. In other words, when the first Y-axial driving voltage VDY1 and the second Y-axial driving voltage VDY2 are linearly increased, the projection positions of the laser beam LB along the Y1 axis do not linearly shift. In some embodiments of the invention, a corresponding relationship between the first Y-axial driving voltage VDY1 and the projection positions of the laser beam LB along the Y1 axis and a corresponding relationship between the second Y-axial driving voltage VDY2 and the projection positions of the laser beam LB along the Y1 axis are approximate to quadratic curves, and thus, a voltage-to-position table may be established using a simple mathematical formula (e.g., $y=x^2$). However, in actual semiconductor manufacturing processes, the ideal condition that electrical characteristics of the second driving electrode 15 and the third driving electrode 17 match each other can not be achieved, and namely, the first Y-axial driving voltage VDY1 and the second Y-axial driving voltage VDY2 can not have exactly the same sensitivity. Therefore, in the invention, the way of driving the electrostatic MEMS scanning mirror 10 has to be calibrated to conform the actual electrical characteristics.

In the present embodiment, a driving calibration apparatus 100 includes a voltage setting unit 110, an image capture unit 120 and a data processing unit 130. The voltage setting unit 110 is coupled to the second driving electrode 15 and the third driving electrode 17 to set a plurality of different reference voltages to drive the plane mirror 11 to swing. In an embodiment, the voltage setting unit 110 sequentially sets first Y-axial driving voltage VDY1 to be a plurality of different first reference voltages and sets the second Y-axial driving voltage VDY2 to be a plurality of different second reference voltages. Each of the first Y-axial driving voltage VDY1 and the second Y-axial driving voltage VDY2 is a ground voltage as default. When both the first Y-axial driving voltage VDY1 and the second Y-axial driving voltage VDY2 are the ground voltage, the plane mirror 11 does not swing. In the present embodiment, when a driving calibration operation is performed, at least one of the first Y-axial driving voltage VDY1 and the second Y-axial driving voltage VDY2 is maintained as the ground voltage, while the other Y-axial driving voltage is set to be a plurality of different reference voltages. In an embodiment, a voltage difference between the neighboring first reference voltages in the first reference voltages may be set to be equal to each other, and a voltage difference between the neighboring second reference voltages in the second reference voltages may be set to be equal to each other, but the invention is not limited thereto.

The image capture unit 120 serves to sense projection positions of a plurality of light spots projected on the projected surface 20 by the laser beam LB which is reflected by the electrostatic MEMS scanning mirror 10. When the voltage setting unit 110 drives the plane mirror 11 to swing sequentially according to the reference voltages, the image capture unit 120 senses a plurality of projection positions that the laser beam LB projects to on the projected surface 20 corresponding to a plurality of reference voltages. The data processing unit 130 is coupled to the voltage setting unit 110 and the image capture unit 120. The data processing unit 130 establishes a driving lookup table according to the reference voltages and the projection positions corresponding thereto and determines a plurality of calibrated driving voltages corresponding to a plurality of ideal projection positions according to the driving lookup table, such that the voltage setting unit 110 drives the plane mirror 11 to swing according to the calibrated driving voltages.

Figure 2:
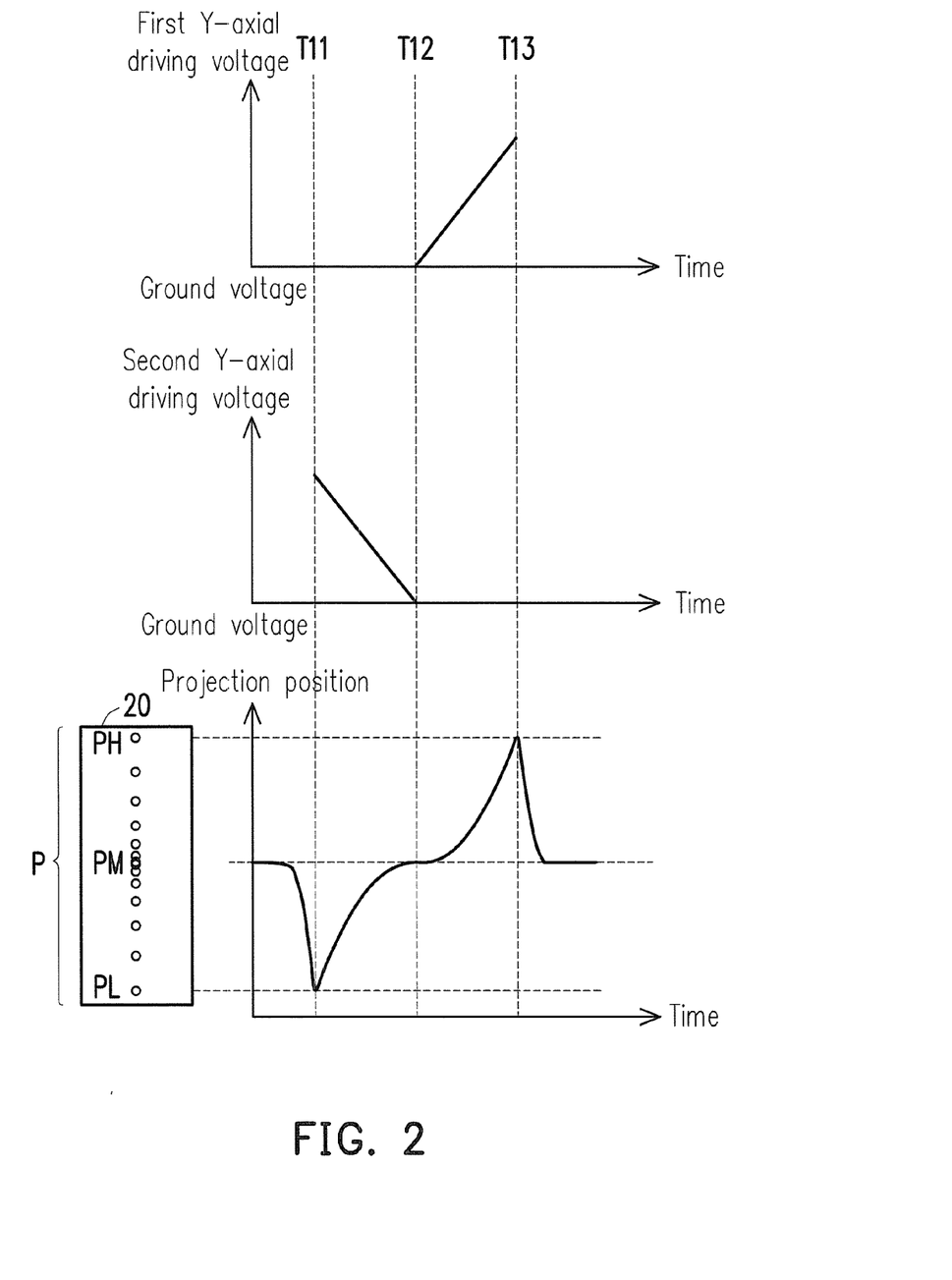
FIG. 2 is a timing diagram of the driving voltages and the projection positions of the driving calibration apparatus illustrated in FIG. 1 when the driving calibration operation is performed.

FIG. 2 is a timing diagram of the driving voltages and the projection positions of the driving calibration apparatus illustrated in FIG. 1 when the driving calibration operation is performed. In the present embodiment, an example where a plurality of different reference voltages of the first Y-axial driving voltage VDY1 and a plurality of different reference voltages of the second Y-axial driving voltage VDY2 are set to linearly shift based on time is illustrated to describe how the driving calibration apparatus performs the driving calibration operation. With reference to FIG. 1 and FIG. 2, in the present embodiment, at a time point T11, the first Y-axial driving voltage VDY1 is set to be a ground voltage, and the second Y-axial driving voltage VDY2 is set to be a maximum voltage. A projection position P of the laser beam LB projected along the Y1 axis on the projected surface is located in a lowest projection position PL due to the swinging of the plane mirror 11.

During a time period from the time point T11 to a time point T12, the second Y-axial driving voltage VDY2 is set to be a plurality of different second reference voltages in a sequence from the maximum to the minimum, while the first Y-axial driving voltage VDY1 is set to be the ground voltage (i.e., the first Y-axial driving voltage VDY1 is set to be the initial voltage). In this case, the projection position P of the laser beam LB along the Y1 axis on the projected surface 20 shifts from bottom to top (e.g., from the lowest projection position PL to a middle projection position PM) with the swinging of the plane mirror 11. However, the second Y-axial driving voltage VDY2, the swinging angle of the plane mirror 11 and the projection position P of the laser beam LB are not linearly related to one another. Thus, a trajectory of the projection position P of the laser beam LB shifting corresponding to the time is approximate to a quadratic curve, such that an interval between the neighboring projection positions P of the laser beam LB is gradually decreased from bottom to top. At the time point T12, both the first Y-axial driving voltage VDY1 and the second Y-axial driving voltage VDY2 are the ground voltage, and thus, the plane mirror 11 does not swing, while the projection position P of the laser beam LB reach the middle projection position PM. In the present embodiment, when the driving calibration operation is performed on the swinging around the Y axis, the plane mirror 11 is not driven to swing around the X axis, and namely, the plane mirror 11 is in a static state on the X axis.

Then, during a time period from the time point T12 to a time point T13, the first Y-axial driving voltage VDY1 is set to be a plurality of different first reference voltages in a sequence from the minimum to the maximum, while the second Y-axial driving voltage VDY2 is set to be the ground voltage (i.e., the second Y-axial driving voltage VDY2 is set to be the initial voltage). In this case, the projection position P of the laser beam LB along the Y1 axis on the projected surface 20 starts to shift upward from the middle projection position PM (e.g., from the middle projection position PM to a highest projection position PH) with the swinging of the plane mirror 11, and a trajectory of the projection position P of the laser beam LB shifting based on time is also approximate to a quadratic curve, such that the interval between each neighboring projection positions P of the laser beam LB is gradually increased from bottom to top. At the time point T13, the first Y-axis driving voltage VDV1 reaches the maximum voltage, and namely, the projection position P of the laser beam LB reaches the highest projection position PH. The interval between the neighboring projection positions P of the laser beam LB is shorter at an intermediate position near the middle projection position PM and is longer at two side positions near the lowest projection position PL and the highest projection position PH. As a result, the electrostatic MEMS scanning mirror 10 forms non-uniform scanning intervals, and an image projected by the electrostatic MEMS scanning mirror 10 is presented in non-uniform brightness. In other words, when the projection positions of the laser beam LB are more concentrated (i.e., near the middle position), the image projected by the electrostatic MEMS scanning mirror 10 is brighter, and when the projection positions of the laser beam LB are sparser (i.e., near the positions at the sides), the projected image is darker, which lead to non-uniform brightness of the projected image.

In the present embodiment, during the process of setting the different reference voltage to drive the plane mirror 11 to swing, the image capture unit 120 simultaneously senses positions of a plurality of light spots projected by the laser beam LB on the projected surface 20. In the present embodiment, each of the reference voltages has a corresponding projected light spot position. Then, the data processing unit 130 identifies an actual relation curve of the driving voltages and the projection positions according the relationship between each of the difference reference voltages and the corresponding projected spot position so as to establish a driving lookup table.

Figure 3A:
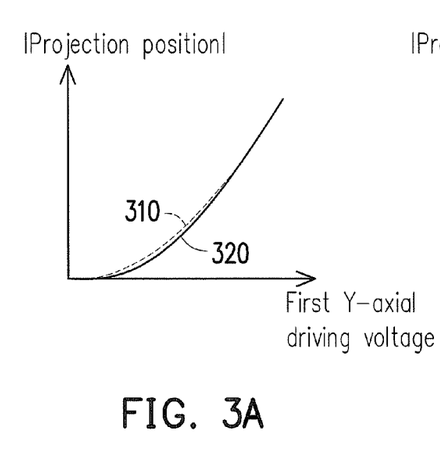
FIG. 3A and FIG. 3B are respectively schematic graphs showing a relationship between the first Y-axis driving voltage and projection positions and a relationship between the second Y-axial driving voltage and projection positions.
Figure 3B:
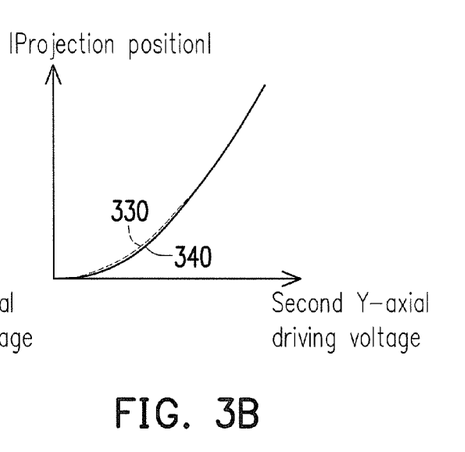

FIG. 3A and FIG. 3B are respectively schematic graphs showing a relationship between the first Y-axis driving voltage and projection positions and a relationship between the second Y-axial driving voltage and projection positions. The projection positions are presented by absolute values thereof. To be more specific, based on the middle projection position PM, the more distant a projection position from the middle projection position PM, the greater absolute value the projection position has. With reference to FIG. 3A, a curve 310 illustrates an ideal relationship between the first Y-axial driving voltage VDY1 and the projection positions when the second Y-axial driving voltage VDY2 is set to be the ground voltage, and a curve 320 illustrates an actual relationship between the first Y-axial driving voltage VDY1 and the projection positions when the second Y-axial driving voltage VDY2 is set to be the ground voltage. With reference to FIG. 3B, a curve 330 illustrates an ideal relationship between the second Y-axial driving voltage VDY2 and the projection positions when the first Y-axial driving voltage VDY1 is set to be the ground voltage, and a curve 340 an actual relationship between the second Y-axial driving voltage VDY2 and the projection positions when the first Y-axial driving voltage VDY1 is set to be the ground voltage. The curves 320 and 340 illustrate the actual relationships between the driving voltages and the projection positions according to the relationships between each of the different reference voltages and the actually corresponding projection position by means of the aforementioned process of setting a plurality of different reference voltages to drive the plane minor to swing and detecting the actual projection positions. The curves 310 and 330 illustrate ideal relationships between the driving voltages and the projection positions, which is established by using a simple mathematical formula (e.g., y=x^2).

Referring to FIG. 3A and the FIG. 3B, the curves 310 and 320 does not entirely overlap with each other, and the curves 330 and 340 does not entirely overlap with each other. Namely, the actual characteristics of the electrostatic MEMS scanning mirror 10 are not exactly the same as the ideal characteristics, and as a result, if the driving voltages are controlled according to the ideal relationships, the actual correct projection positions are incapable of being generated, and once the projection positions have offsets, the image projected by the electrostatic MEMS scanning minor 10 cannot be sufficiently smooth. In order for the electrostatic MEMS scanning mirror 10 to project a smooth image with uniform brightness, the interval between neighboring projected light spots on the projected surface 20 that the laser beam LB projects to is generally set to be a constant value. In the present embodiment, the data processing unit 130 may pre-set ideal projection positions of the projected light spots on the projected surface 20 that the laser beam LB projects to and set the interval between the ideal projected light spots to be a constant value. In the present embodiment, after an actual relation curve between the driving voltages and the projection positions and a driving lookup table thereof are obtained, the data processing unit 130 may determine a voltage level of the driving voltage corresponding to each of the ideal projection positions according to the actual relation curves 320 and 340 and the driving lookup table thereof, such that the voltage level may serve as the calibrated driving voltage for driving the plane mirror 11 to swing.

Figure 4:
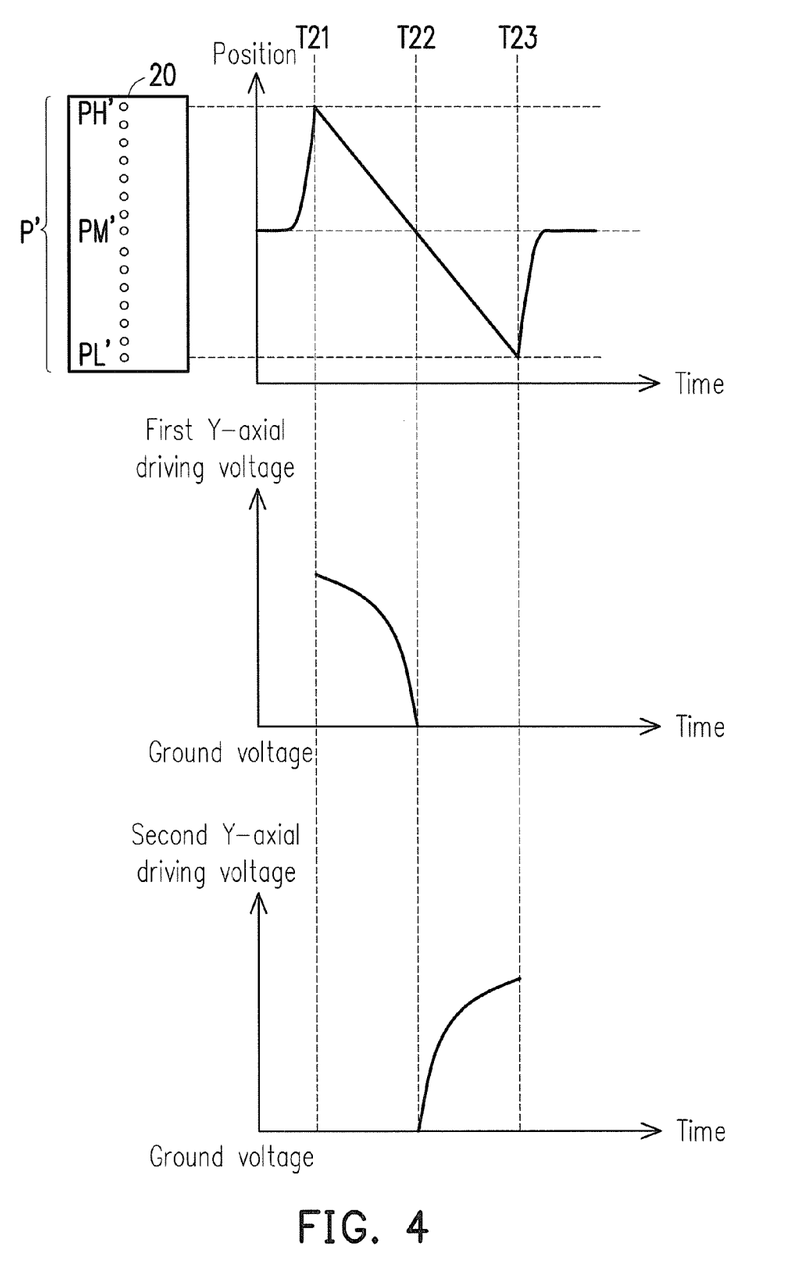
FIG. 4 is a timing diagram of the projection positions for driving the electrostatic MEMS scanning mirror by using a calibrated first Y-axis driving voltage and a calibrated second Y-axial driving voltage.

FIG. 4 is a timing diagram of the projection positions for driving the electrostatic MEMS scanning mirror by using a calibrated first Y-axis driving voltage and a calibrated second Y-axial driving voltage. With reference to FIG. 3 and FIG. 4, an ideal projection position P' on the projected surface 20 that the laser beam LB projects to is pre-set to be a plurality of ideal projection positions P' having an constant interval. Then, the data processing unit 130 determines a calibrated driving voltage corresponding to each of the ideal projection positions P' according to the driving lookup table. In the present embodiment, at a time point T21, the ideal projection position P' of the laser beam LB on the projected surface is set to be a highest ideal projection positions PH', and the data processing unit 130 determines a calibrated driving voltage corresponding to the ideal projection positions PH' according to the driving lookup table. In the present embodiment, when the electrostatic MEMS scanning mirror 10 is in a normal operation (i.e., in a normal projection operation), the first Y-axial driving voltage VDY1 is set to be a calibrated driving voltage corresponding to the highest ideal projection positions PH', and the second Y-axial driving voltage VDY2 is set to be the ground voltage so as to project the laser beam LB to the highest ideal projection positions PH' on projected surface 20. Similarly, during a time period from the time point T21 to a time period T23, the data processing unit 130 determines a calibrated driving voltage of each of the ideal projection positions P' according to the driving lookup table, such that the electrostatic MEMS scanning mirror 10 of the invention may drive the plane mirror to swing according to actual characteristics thereof, and the laser beam LB may correctly project to each of the ideal projection positions P' on the projected surface 20. Referring to FIG. 4, in the present embodiment, according to the driving lookup table and curves of calibrated driving voltages of the first Y-axial driving voltage VDY1 and the second Y-axial driving voltage VDY2 obtained corresponding to the ideal projection positions P', the data processing unit 130 may utilize a calibrated first Y-axial driving voltage VDY1 and a calibrated second Y-axial driving voltage VDY2 to drive the plane mirror 11 to swing, so as to correctly project the laser beam LB to each of the ideal projection positions P' on the projected surface 20. In other words, when the voltage setting unit 110 of the invention utilizes the calibrated driving voltages to drive the plane mirror 11 to swing, the projection positions of the laser beam LB are a plurality of continuous points with an equal interval spacing from each other and locate on a straight line to provide a smooth image displayed with uniform brightness.

Figure 5:
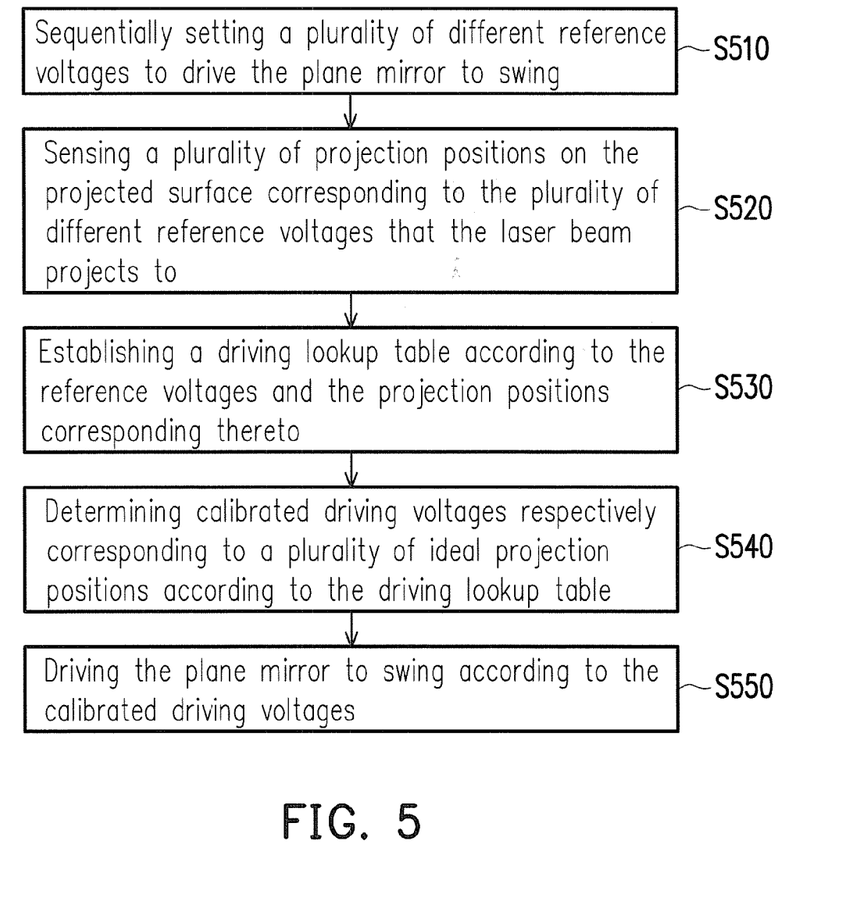
FIG. 5 is a flowchart of a driving calibration method of the electrostatic MEMS scanning mirror according to an embodiment of the invention.

FIG. 5 is a flowchart of a driving calibration method of the electrostatic MEMS scanning mirror according to an embodiment of the invention. With reference to FIG. 5, the driving calibration method of the present embodiment may be applied to the electrostatic MEMS scanning mirror 10 illustrated in FIG. 1 and includes the following steps. Sequentially setting a plurality of reference voltages to drive a plane mirror to swing by a voltage setting unit (step S510). And, sensing a plurality of projection positions on a projected surface corresponding to the plurality of different reference voltages that a laser beam projects to by an image capture unit (step S520). Each of the reference voltage has a corresponding projection position. Then, establishing a driving lookup table according to the reference voltages and the corresponding projection positions by a data processing unit (step S530). Afterward, determining a plurality of calibrated driving voltages respectively corresponding to a plurality of ideal projection positions according to the driving lookup table by the data processing unit (step S540). Each of the ideal projection positions has a corresponding calibrated driving voltage. Thereafter, driving the plane minor to swing according to the calibrated driving voltages by the voltage setting unit (step S550). Herein, the order of steps S510, 5520, S530, S540 and S550 are for the purpose of illustration, and is not limited in the invention. Meanwhile, details with respect to steps S510, S520, S530, S540 and S550 may refer to the descriptions of the embodiments above with reference to FIG. 1, FIG. 2, FIG. 3A, FIG. 3B and FIG. 4, and will not be repeatedly described.

To sum up, in the driving calibration apparatus of the electrostatic MEMS scanning minor of the invention and the driving calibration method thereof, a plurality of different reference voltage is sequentially set to drive the plane minor and the corresponding projection positions thereof are sensed to define the curve of the actual relationship between the driving voltages and the projection positions so as to establish the driving lookup table. According to the driving lookup table set forth in the invention, the calibrated driving voltage respectively corresponding to each of the ideal projection positions can be determined, and thereby, the laser beam can correctly project to the ideal projection positions so as to avoid the issue of non-uniform brightness of the image.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A driving calibration apparatus of an electrostatic MEMS scanning mirror comprising a plane mirror serving to guide a laser beam to project on a projected surface, the driving calibration apparatus comprising:

a voltage setting unit, serving to set a plurality of different reference voltages to drive the plane mirror to swing;

a image capture unit, serving to sense a plurality of projection positions on the projected surface corresponding to the plurality of reference voltages that the laser beam projects to; and a data processing unit, serving to establish a driving lookup table according to the reference voltages and the corresponding projection positions and determine calibrated driving voltages corresponding to a plurality of ideal projection positions according to the driving lookup table, wherein the voltage setting unit drives the plane mirror to swing according to the calibrated driving voltages.

2. The driving calibration apparatus of the electrostatic MEMS scanning mirror according to claim 1, wherein the reference voltages are between a ground voltage and a maximum voltage.

3. The driving calibration apparatus of the electrostatic MEMS scanning mirror according to claim 1, wherein voltage differences between the reference voltages are the same.

4. The driving calibration apparatus of the electrostatic MEMS scanning mirror according to claim 1, wherein the plane mirror is being swung around a first axis and a second axis, and when the voltage setting unit sequentially sets the different reference voltages to drive the plane mirror to swing around the first axis, the plane mirror is in a static state on the second axis.

5. The driving calibration apparatus of the electrostatic MEMS scanning mirror according to claim 1, wherein the ideal projection positions are set to be a plurality of projection positions of light spots on the projected surface that are projected to by the laser beam, and the ideal projection positions have a constant interval spacing from each other.

6. A driving calibration method of an electrostatic MEMS scanning mirror, wherein the electrostatic MEMS scanning minor comprises a plane mirror for guiding a laser beam to project on a projected surface, the method comprising:

sequentially setting a plurality of different reference voltages to drive the plane mirror to swing;

sensing a plurality of projection positions on the projected surface corresponding to the plurality of different reference voltages that the laser beam projects to;

establishing a driving lookup table according to the reference voltages and the corresponding projection positions;

determining calibrated driving voltages respectively corresponding to a plurality of ideal projection positions according to the driving lookup table; and driving the plane minor to swing according to the calibrated driving voltages.

7. The method according to claim 6, wherein each of the reference voltages has a corresponding projection position.

8. The method according to claim 6, wherein voltage differences between the reference voltages are the same.

9. The method according to claim 6, wherein the plane mirror is being swung around a first axis and a second axis, when the voltage setting unit sequentially sets the different reference voltages to drive the plane mirror to swing around the first axis, the plane mirror is in a static state on the second axis.

10. The method according to claim 6, wherein the ideal projection positions are set to be a plurality of projection positions of light spots on the projected surface that the laser beam projects to, and the ideal projection positions have a constant interval spacing from each other.

* * * * *